United States Patent [19]

Dinger et al.

[11] 4,437,773
[45] Mar. 20, 1984

[54] QUARTZ THERMOMETER

[75] Inventors: Rudolf Dinger, St. Aubin; Jean-Georges Michel; Claude-Eric Leuenberger, both of Neuchatel, all of Switzerland

[73] Assignee: Asulab S.A., Neuchatel, Switzerland

[21] Appl. No.: 295,777

[22] Filed: Aug. 24, 1981

[30] Foreign Application Priority Data

Aug. 29, 1980 [CH]  Switzerland ........................ 6508/80
Apr. 21, 1981 [CH]  Switzerland ........................ 2588/81

[51] Int. Cl.³ .......................................... G01K 11/22
[52] U.S. Cl. ................................... 374/117; 310/318; 310/361
[58] Field of Search ............... 374/117, 183, 118, 119; 331/66, 156, 163, 154; 310/361, 318

[56] References Cited

U.S. PATENT DOCUMENTS

| | | | |
|---|---|---|---|
| 2,284,753 | 6/1942 | Mason | 310/361 |
| 3,329,004 | 7/1967 | King, Jr. | 73/23 |
| 3,350,942 | 11/1967 | Peltola | 374/117 X |
| 3,423,609 | 1/1969 | Hammond | 310/361 |
| 3,792,294 | 2/1974 | Royer | 310/9.5 |
| 3,792,377 | 2/1974 | Fujita et al. | 331/66 X |
| 3,826,931 | 7/1974 | Hammond | 310/8.1 |
| 3,879,992 | 4/1975 | Bartera | 73/23 X |
| 4,039,969 | 8/1977 | Martin | 374/183 X |
| 4,140,999 | 2/1979 | Conway | 331/66 X |
| 4,178,566 | 12/1979 | Kawashima | 331/163 X |

FOREIGN PATENT DOCUMENTS 266211  6/1961  Netherlands ........................ 331/163

OTHER PUBLICATIONS

Publication: IDC Technical Report 54–248, "Handbook of Piezoelectric Crystals for Radio Equipment Designers", J. P. Buchanan, pp. 11–12, 18–22, (12/54).
Publ. "Digital Quartz Thermometer," Gniewinska et al., pp. 23–24, Polish Technical Review (Poland), No. 4–5, 1980.
Publ. "A Linear Quartz Crystal Temperature Sensing Element", D. L. Hammond et al., pp. 1–5, Instr. Society of America, Oct. 12, 1964.
Publ., "Piezoelectric Crystals and Their Application to Ultrasonics", W. P. Mason, PhD, pp. 83, 90–92, 100–102.

*Primary Examiner*—Daniel M. Yasich
*Attorney, Agent, or Firm*—Spensley, Horn, Jubas & Lubitz

[57] ABSTRACT

A quartz thermometer which emits a signal, the frequency of which is a substantially linear function of temperature. The thermometer comprises a quartz resonator provided with electrodes disposed on the margins of the upper and lower main surfaces, parallel to the length direction. The electrodes are supplied with electric current so as to cause the resonator to vibrate torsionally. The length of the resonator is substantially parallel to the X axis of the quartz crystal. An electronic circuit is responsive to the signal emitted by the resonator for producing an output representative of temperature.

15 Claims, 13 Drawing Figures

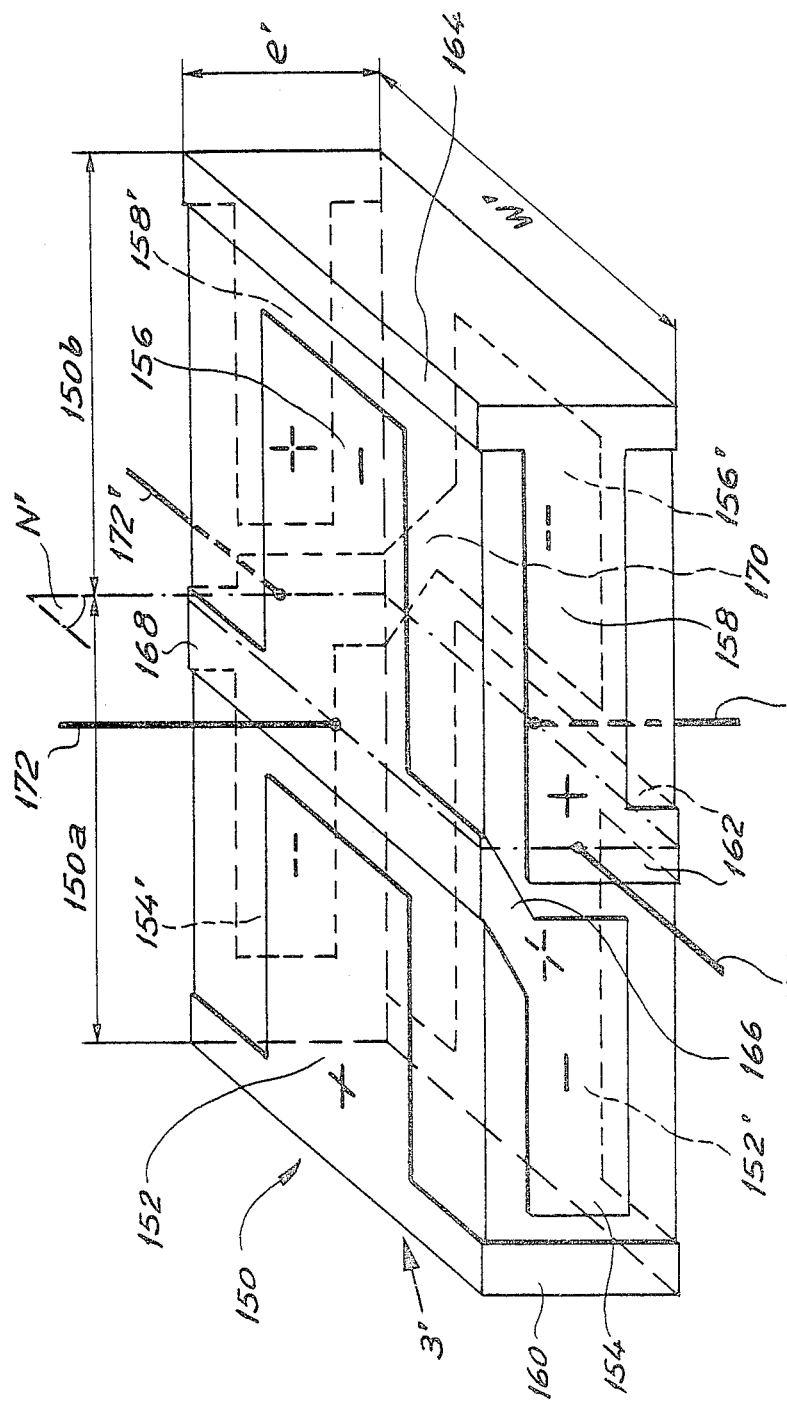

QUARTZ THERMOMETER

BACKGROUND OF THE INVENTION

1. Field of the Invention

The present invention relates to a quartz thermometer and, more particularly, to a thermometer in which the temperature-sensitive element is a quartz resonator which is driven by an oscillator circuit so as to produce an electrical signal, the frequency of which is representative of the temperature to which the resonator is subjected.

2. Description of the Prior Art

Temperature measuring devices which use a quartz resonator as the temperature-sensitive element are well known. It is also well known that the frequency of such a resonator varies with temperature. The relationship between the frequency of oscillation of quartz and temperature may be represented by the following polynomial expression:

$$f_T = f_{To}[1 + \alpha(T - T_o) + \beta(T - T_o)^2]$$

where $f_{To}$ and $T_o$ are constants, T is the temperature to be measured, $f_T$ is the frequency of the quartz oscillator subjected to temperature T, and $\alpha$ and $\beta$ are coefficients that are independent of temperature.

In general, it is not sufficient that the frequency of a quartz oscillator depends on temperature, it being very desirable that this dependence be as linear as possible. The main advantage of this type of thermometer, as compared with all other known devices, resides in the direct conversion of temperature to frequency, i.e. the information regarding temperature is presented in a quasi-numerical form. Another advantage of this type of thermometer is that the frequency is a physical quantity which can be measured with a degree of resolution as great as is desired if the measurement time is sufficient.

There are presently available on the market thermometers provided with a probe containing a vibrating quartz crystal, the frequency of which depends on temperature in a very linear manner. A first apparatus, made by Hewlett-Packard, uses an LC cut quartz crystal which is excited to a freuquency of 28 MHz. This instrument has a sensitivity on the order of 1000 Hz per °C. Another apparatus, made by Tokyo Dempa, uses a YS cut quartz crystal excited to a frequency on the order of 10 MHz. This instrument has a sensitivity of the same order of magnitude as the Hewlett-Packard instrument.

On the other hand, these two high precision instruments are very expensive and the quartz resonators used as the sensitive elements thereof have the disadvantage of being very cumbersome, since they are produced by means of a technology which does not permit easy miniaturization. Moreover, their methods of manufacture are unsuitable for mass production. Furthermore, since they are arranged to vibrate at a frequency equal to or greater than 10 MHz, the electronic circuits which process the signals emitted by the quartz resonators consume a relatively high amount of electrical energy.

OBJECTS

It is therefore an object of the present invention to provide a quartz thermometer which has good linearity in terms of temperature and which can be made relatively compact.

It is a further object of the present invention to provide a quartz thermometer in which the resonator is easy to produce by modern manufacturing methods, such as chemical etching.

It is a still further object of the present invention to provide a quartz thermometer in which the electronic circuitry is relatively simple.

It is another object of the present invention to provide a quartz thermometer which operates at frequencies lower than those of the prior art in order to reduce the consumption of electrical energy by the circuit associated with the quartz resonator.

It is still another object of the present invention to provide a quartz thermometer in which the quartz resonator has a dynamic capacitance $C_1$ which is sufficient to be able to cause the resonator to oscillate in a stable manner with an acceptably low consumption of electrical energy.

SUMMARY OF THE INVENTION

In order to achieve these objects, the present invention utilizes a quartz resonator, the length of which is substantially parallel to the X axis of the quartz, the quartz resonator being provided with electrodes which are disposed and fed with electric current in such a manner that the resonator vibrates torsionally. The resonator is constituted either by a tuning fork or by a bar.

According to a first embodiment, the direction perpendicular to the upper and lower surfaces of the tuning fork or bar forms with the Z axis of the crystal an angle $\theta$ within the range of from $-30°$ to $+30°$. Electrodes are disposed parallel to the length of the resonator. There are two electrodes on the upper main surface of each bar half or tuning fork tine and two on the lower surface thereof. These electrodes are supplied with electric current so as to cause them to vibrate torsionally. The resonator delivers an electrical signal, the frequency variations of which are a substantially linear function of temperature.

According to a second embodiment of the present invention, the direction perpendicular to the upper and lower main surfaces of the tuning fork or bar forms with the Z axis of the crystal an angle $\theta$ within the range of from $-30°$ to $+50°$ or within the range of from $-30°$ to $-50°$. Electrodes are disposed parallel to the longitudinal direction of the resonator, each main surface of a tine of the tuning fork or each main surface of the bar being provided with a respective electrode and each edge of a tine of the tuning fork or each edge of the bar likewise being provided with a respective electrode. These electrodes are supplied with electric current so as to cause the resonator to vibrate torsionally. The resonator delivers an electrical signal, the frequency of which is a substantially linear function of temperature.

The term "linear" is to be understood to mean that in the polynomial relationship between frequency and temperature, the coefficient $\alpha$ of the first degree is very much higher than the coefficient $\beta$. This does not necessarily mean that the coefficient $\beta$ is zero. For example, the ratio of these two coefficients may be of the order of $10^2$ to $10^3$.

Preferably, the ratio of the thickness e to the length w of the quartz element is chosen so that the absolute value of $\alpha$ is substantial in order that the resonator is greatly dependent on temperature, i.e. it has a high degree of sensitivity. This ratio is preferably between 0.1 to 0.8.

Other objects, features, and attendant advantages of the present invention will become apparent to those skilled in the art from a reading of the following detailed description of the preferred embodiments constructed in accordance therewith, taken in conjunction with the accompanying drawings, wherein like numerals designate like parts in the several figures, and wherein:

BRIEF DESCRIPTION OF THE DRAWINGS

FIG. 8 is a perspective view of a second quartz bar which can be used with the present invention;

DESCRIPTION OF THE PREFERRED EMBODIMENTS

The thermometer according to the present invention comprises, on the one hand, a quartz resonator, the electrodes of which are located and supplied with electric current so that the resonator vibrates torsionally and, on the other hand, an electric circuit for producing an indication of the temperature measured by the resonator.

Figure 1:
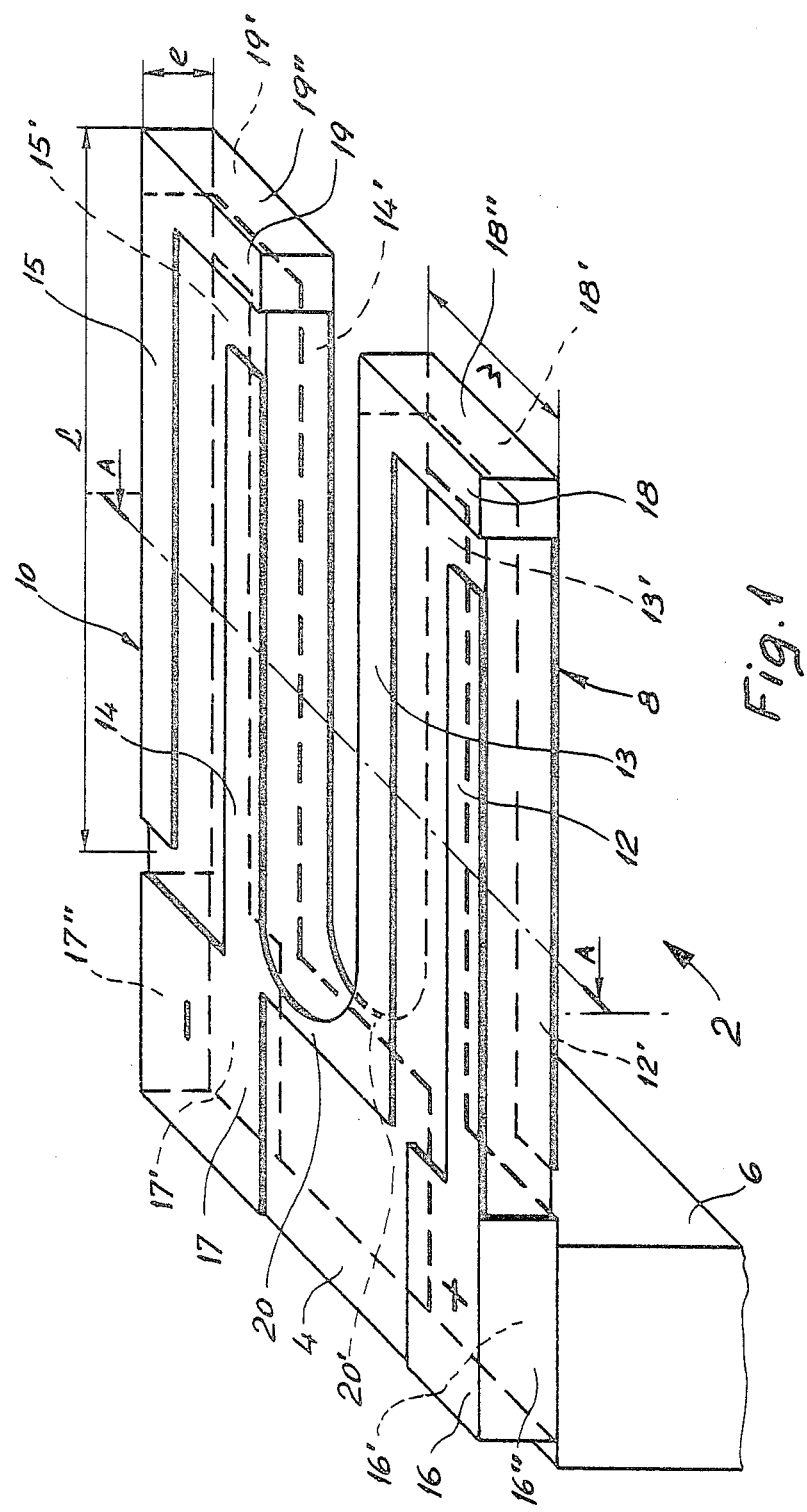
FIG. 1 is a perspective view of a first resonator in the form of a tuning fork which can be used with the present invention.
Figure 1A:
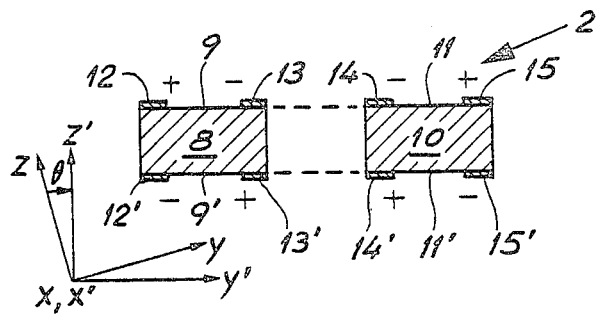
FIG. 1a is a sectional view taken along the line A—A in FIG. 1.
Figure 3:
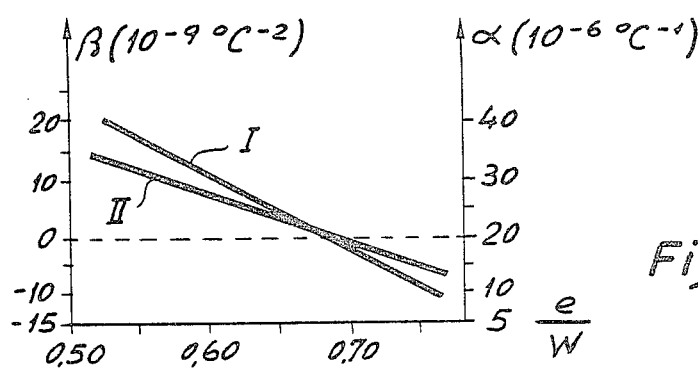
FIG. 3 is a series of curves indicating the temperature coefficient $\alpha$ of the first order and $\beta$ of the second order of a resonator which is torsionally excited, for a cut angle of $\theta = +2°$ with respect to the Z axis of the quartz, as a function of the ratio e/w of the thickness and length dimensions of the quartz element.

Referring now to the drawings and, more particularly, to FIGS. 1, 1a and 3 thereof, there is shown a first embodiment of a resonator in the form of a quartz tuning fork, generally designated 2. Tuning fork 2 has a base 4 by means of which it is fixed on a pedestal 6. Tuning fork 2 also has two tines 8 and 10, the cross sections of which are substantially rectangular. Each tine has a short side, the length e of which is equal to the thickness of tuning fork 2 and a long side, the length w of which is equal to the width of each tine of tuning fork 2. Each tine 8 and 10 of tuning fork 2 thus has the form of a rectangular parallelepiped. The directions corresponding to the length L, the width w and the thickness e of each tine 8 and 10 of tuning fork 2 are indicated in FIG. 1a by the axes X', Y' and Z', respectively. FIG. 1a also shows the orientation of the axes X', Y' and Z' of resonator 2 with respect to the X, Y and Z axes of the quartz element.

Tuning fork 2 is cut in such a manner that its length L is disposed substantially in alignment with the X axis of the quartz, i.e. the directions X and X' are substantially identical. The Z' axis, however, of tuning fork 2 is inclined at an angle $\theta$ to the optical axis of the quartz element. The same, of course, applies to the Y' axis in relation to the Y axis.

As has been previously explained, tuning fork 2 must be excited so as to vibrate torsionally. For this purpose, metallic coatings are deposited on the main, opposed surfaces 9 and 9' and 11 and 11' corresponding to the width w of tines 8 and 10, respectively, of tuning fork 2. More specifically, each main surface of each tine of tuning fork 2 is provided with two electrodes extending parallel to the length of the tines and located on the margins of the main surfaces, that is to say close to the flank surfaces of each tine. As shown in FIG. 1a, main surface 9 of tine 8 is provided with electrodes 12 and 13, while surface 9' thereof is provided with electrodes 12' and 13'. In like manner, surfaces 11 and 11' of tine 10 are provided with electrodes 14, 15 and 14', 15', respectively. The electrodes on the same surface of each tine are maintained at different potentials and the electrodes opposite to each other on each tine are likewise maintained at different potentials. Furthermore, the two inside electrodes on the same main surface (upper or lower) are at the same potential. Thus, in FIG. 1a, electrodes 12, 13', 14' and 15 are maintained at a positive potential, while electrodes 12', 13, 14 and 15' are maintained at a negative potential. Tines 8 and 10 of tuning fork 2 are thus caused to vibrate torsionally. Furthermore, this arrangement enables tines 8 and 10 of tuning fork 2 to be made to vibrate asymmetrically in order to compensate for their respective kinetic moments.

FIG. 1 shows a practical way of arranging the conductive metal coatings for forming the electrodes in such a way that the connections between the electrodes will be maintained at the same potentials. In this figure, in order to make the disposition of the metal coatings more clearly visible, no regard has been had to the proportions of the dimensions of tuning fork 2.

Electrodes 12 and 14 are extended as far as base 4 by conductive coatings 16 and 17, respectively, which form contact elements at positive and negative potentials, respectively. Electrodes 13 and 15 are extended by conductive coatings 18 and 19 located on the free ends of tines 8 and 10, respectively. In addition, a conductive coating 20 interconnects electrodes 13 and 14 and a conductive coating 20' interconnects electrodes 13' and 14'. Electrodes 13' and 15' are extended by conductive coatings 16' and 17', respectively, as far as base 4. Electrodes 12' and 14' are extended by conductive coatings 18' and 19', respectively, opposite coatings 18 and 19, respectively.

The electrical connection between the conductive coatings on the two main surfaces is provided by metallic coatings on the edges and ends of tines 8 and 10 and base 4. More specifically, coatings 18 and 18' are interconnected by a metallic coating 18", while coatings 19 and 19' are interconnected by a metallic coating 19"'. At base 4, coatings 16 and 16' are interconnected by a metallic coating 16", while coatings 17 and 17' are interconnected by a metallic coating 17". These metallic coatings are formed in a conventional manner by depositing a layer of chromium and a layer of gold, or a layer of aluminum or other metal. It will be observed that the only coatings provided on the edges of tines 8 and 10 do not form electrodes in the strict sense of this term and that the zones where these coatings have to be formed are easily accessible (the ends of tines 8 and 10 and the lateral edges of base 4). The production of these coatings is well within the skill of the art.

In order to obtain a good linear relationship between temperature and the frequency of the signal emitted by the thermometer, it is necessary to select the angle $\theta$ and the value of the ratio e/w so that they lie between certain limits. In order to optimize the linearity of the response in the sense previously defined, it is necessary to take into account the relationship between the values selected for the angle $\theta$ and the value of the ratio e/w. More particularly, with electrodes of the type selected, the angle $\theta$ must be between $-30°$ and $+30°$. Moreover, it is necessary that the value of the ratio e/w should be between 0.4 and 0.8.

FIG. 3 gives, for $\theta = +2°$, the value of the coefficient $\beta$ expressed as $10^{-9°}$ C.$^{-2}$ (curve I) and the value of the coefficient $\alpha$ expressed as $10^{-6°}$ C.$^{-1}$ (curve II) for different values of the ratio e/w. Curves I and II show that it is possible to produce a resonator in which the coefficient $\beta$ is zero. The response of the thermometer is then perfectly linear. Curves I and II also show that it is possible to select the ratio e/w so that the coefficient $\beta$ remains very small although the value of $\alpha$ is high, so that the thermometer is very sensitive.

The length L of tines 8 and 10 of tuning fork 2 is chosen so that the frequency of tuning fork 2 should be of the order of several hundreds kilohertz, typically a multiple of 32,738 Hz, which is the frequency of quartz used as a time base in watches.

By way of example, a thermometer has been produced with a torsionally excited quartz tuning fork which has the following characteristics:

$\theta = +2°$
w = 0.230 mm
e = 0.125 mm
e/w = 0.55
L = 2.75 mm (the length of one tine of tuning fork 2).

In this case, the frequency of excitation was selected to be 262,144 Hz and the coefficients of the thermometer are:

$\alpha = 35 \times 10^{-6°}$ C.$^{-1}$
$\beta = 20 \times 10^{-9°}$ C.$^{-2}$

It is important to observe that the cut angle $\theta = +2°$ corresponds to conventional cut angles utilized for producing quartz resonators which constitute the time base of electronic watches. The method of production is preferably controlled, for example, by chemical attack. Moreover, the dynamic capacitance of tuning fork 2 is 0.33 fF, which is high for a quartz undergoing torsional vibration. It is also necessary to draw attention to the fact that the frequency 262,144 Hz of oscillation is very low compared to the frequencies of several MHz at which the known resonators of thermometers according to the prior art vibrate. Resonator 2 exhibits a very good linearity in its temperature dependence, in the sense in which this expression is used herein. In effect, if $\beta$ is not zero, the value of the function $\alpha/\beta$ is $1.75 \times 10^3$. The effect of the term of the first degree largely preponderates over the term of the second degree. However, the absolute value of $\alpha$ is very high, $35 \times 10^{-6°}$ C.$^{-1}$, which ensures a very great sensitivity to temperature. The two preconditions for having a good thermometer are therefore combined.

FIG. 3 shows that when a ratio e/w equal to 0.68 is selected, a coefficient $\beta$ is obtained which is zero and a coefficient $\alpha$ is obtained which amounts to slightly more than $20 \times 10^{-6°}$ C.$^{-1}$. Once again, therefore, it is a case of a very acceptable value of $\alpha$.

It has previously been indicated that the angle $\theta$ could be within the range of $-30°$ to $+30°$. It must, however, be stated that, by limiting the range to between $-10°$ and $+10°$, the thermal properties are maintained while keeping within cut planes which are relatively close to the Z plane. This allows for resonators which can be easily produced by chemical attack. Besides, by adopting an angle $\theta$ which is slightly negative, for example between $0°$ and $-10°$, and maintaining the ratio e/w within the range already defined, it is possible to obtain a coefficient $\beta$ which is either zero or almost zero, with a coefficient $\alpha$ which is substantially greater than $20 \times 10^{-6°}$ C.$^{-1}$, for example, of the order of at least $30 \times 10^{-6°}$ C.$^{-1}$.

Moreover, the statement that the length of tuning fork 2 is substantially parallel to the X axis signifies that, in order to define the plane of the tuning fork, after the rotation of the angle $\theta$ about the X axis, it can be rotated through a reduced angle about the Y' axis.

Figure 2:
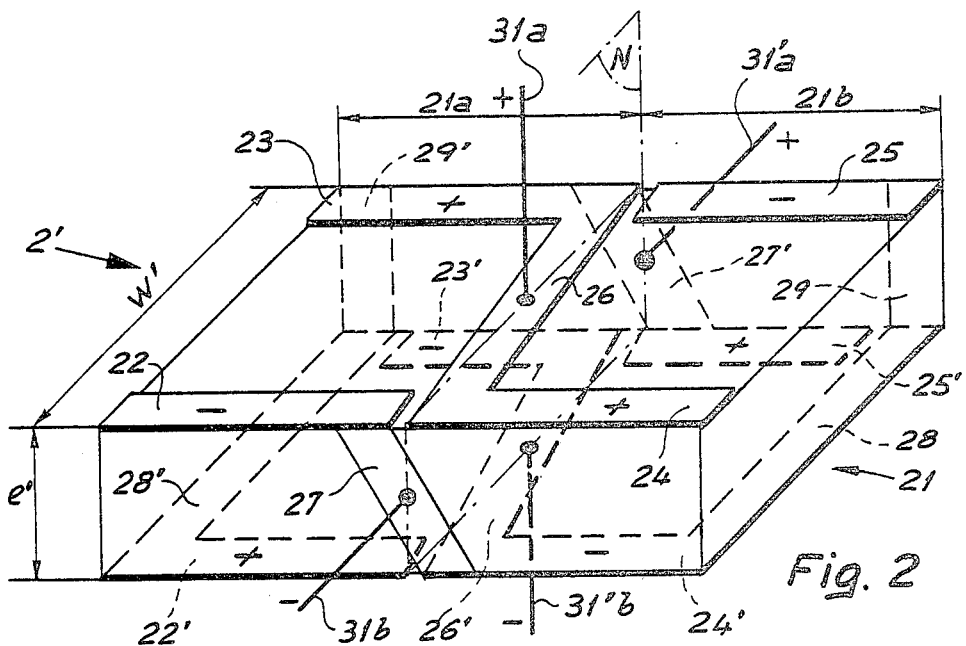
FIG. 2 is a perspective view of a first quartz bar which can be used with the present invention.

FIG. 2 shows another resonator, generally designated 2', which can be used in the thermometer according to the present invention. Resonator 2' has the form of a parallelepipedal bar of width w' and a thickness e'. Resonator 2' is formed from a quartz bar 21 having its longitudinal dimension disposed along the X axis of the quartz and the Z' axis perpendicular to its upper and lower main surfaces inclined at an angle $\theta$ of between $+30°$ and $-30°$ with respect to the Z axis of the quartz.

Electrodes are positioned on the two half bars 21a and 21b which are separated in an imaginary sense by the nodal plane N indicated by a chain-dotted line. Electrodes 22 and 23 are arranged on the upper main surface of half bar 21a, close to its edges. Likewise, electrodes 22' and 23' are arranged on the lower surface of half bar 21a opposite electrodes 22 and 23, respectively. In the case of half bar 21b, electrodes 24 and 25 are located on the upper surface and electrodes 24' and 25' are located on the lower surface opposite to electrodes 24 and 25, respectively.

Since bar 21 is arranged to vibrate torsionally, it is necessary that each half bar have the same disposition of electrodes as one tine of tuning fork 2 shown in FIGS. 1 and 1a and, furthermore, that the two electrodes which are symmetrical with respect to the nodal plane N be maintained at opposite potentials. For this purpose, electrodes 23 and 24 are interconnected by a conductive coating 26 which intersects nodal plane N. Electrodes 22 and 24' are interconnected by a conductive coating 27 which intersects nodal plane N. Electrodes 23 and 25' are interconnected by a conductive coating 27' which likewise intersects nodal plane N. Coatings 27 and 27' are disposed on the edges of bar 21. Electrodes 24' and 25 are interconnected by conductive coatings 28 and 29 provided respectively on the lower surface and on one edge near the end of half bar 21b, while electrodes 22' and 23 are interconnected by conductive coatings 28' and 29' provided respectively on the lower surface and on one edge near the end of half bar 21a.

Lead wires 31a and 31'a are fixed to conductive coatings 26 and 27', respectively, so as to maintain electrodes 22', 23, 24 and 25' at a positive potential. Lead wires 31b and 31'b are fixed to coatings 27 and 26' so as to maintain electrodes 22, 23', 24' and 25 at a negative potential. Lead wires 31a, 31a', 31b and 31b' are all arranged so that they lie in nodal plane N of the torsionally vibrating quartz bar 21 in order to ensure the support of bar 21.

Figure 7:
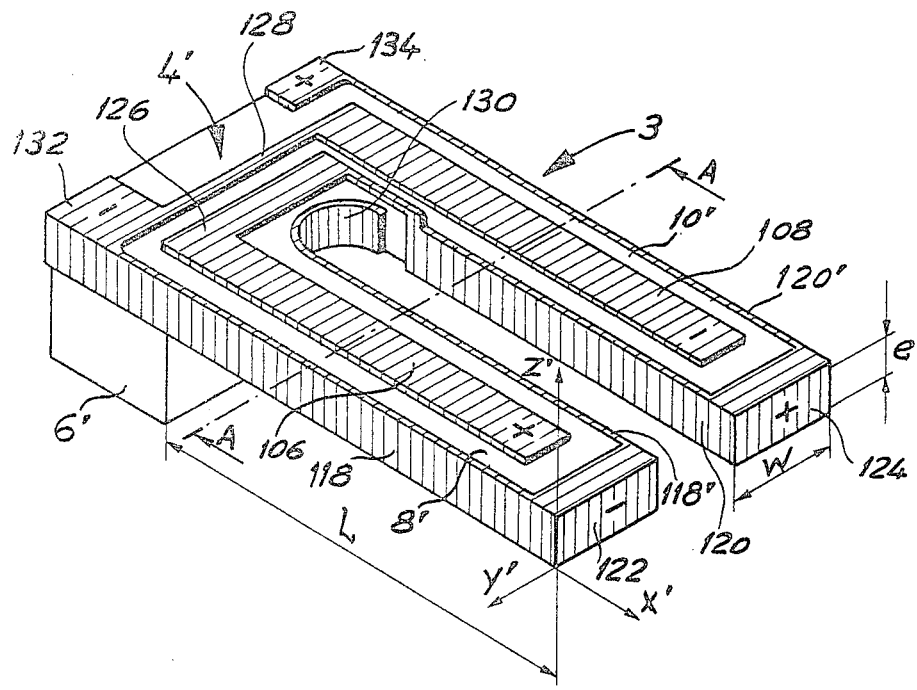
FIG. 7 is a perspective view of a second resonator in the form of a tuning fork which can be used with the present invention.
Figure 7A:
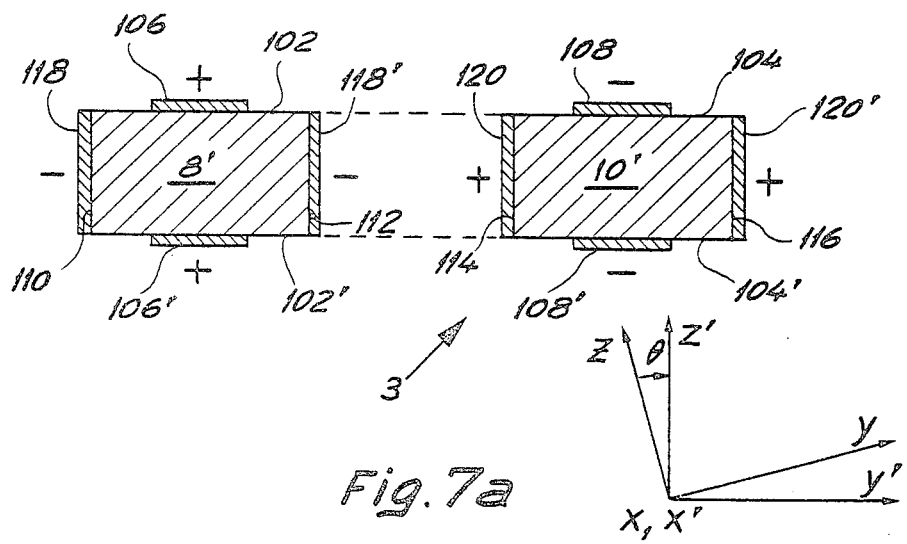
FIG. 7a is a sectional view taken along the line A—A in FIG. 7.

FIGS. 7, 7a and 8 illustrate second embodiments of resonators for the thermometer, in which another range of cut angles is used in association with another disposition of electrodes. FIGS. 7 and 7a are concerned with the case where resonator 3 is in the form of a tuning fork. Tuning fork 3 has a base 4' by means of which it is fixed to a support 6' and two tines 8' and 10' which are substantially parallel to the X axis of the quartz. As can best be seen in FIG. 7a, the upper surfaces 102 and 104 and the lower surfaces 102' and 104' of tines 8' and 10' of tuning fork 3 are provided with longitudinally extending electrodes indicated respectively by the reference numerals 106, 108 and 106', 108'. Likewise, the edges 110 and 112 of tine 8' and edges 114 and 116 of tine 10' are provided respectively with electrodes 118, 118' and 120, 120'. In the case of each tine, the electrodes which are opposite each other are maintained at the same potential and the electrodes which occupy a position on tine 8' are maintained at a potential which is different from that of the electrodes which occupy the same position on tine 10'. For example, electrodes 106, 106', 120 and 120' are maintained at a positive potential and electrodes 118, 118', 108 and 108' are maintained at a negative potential. Torsional vibration of resonator 3 is thus obtained. In addition, tines 8' and 10' vibrate asymmetrically, which enables their respective kinetic moments to be balanced.

FIG. 7 shows an arrangement of the conductive coatings for producing the electrodes and the electrical connections between these electrodes. The electrodes on the upper and lower main surfaces terminate before the ends of tines 8' and 10' in order to enable coatings 122 and 124 to be provided on the ends of the tines, these coatings being able to extend a short distance over and onto the upper and lower main surfaces. Coating 122 interconnects electrodes 118 and 118', while coating 124 interconnects electrodes 120 and 120'. Coating 126 interconnects electrodes 106 and 120 and coating 128 interconnects electrodes 108 and 118. Coating 130 connects electrode 118' to the electrode 108' which is not visible in FIG. 7. A coating (not shown), which is provided on the lower main surface of base 4', interconnects the concealed electrode 106' and electrode 120'. On the upper main surface of base 4', contact elements 132 and 134 are connected to electrodes 118 and 120', respectively. By connecting contact element 132 to a negative voltage and contact element 134 to a positive voltage, the electrode polarizations indicated in FIG. 7a are obtained.

FIG. 8 illustrates the construction and arrangement of a resonator 3' in the form of a bar according to a second embodiment of the invention. In this figure, the relationships shown between the width w', the thickness e' and the length do not correspond with reality, so as to render the drawing easier to read.

In FIG. 8, the bar, generally designated 150, is divided functionally by nodal plane N' into two half bars 150a and 150b. In the case of half bar 150a, electrodes 152, 152' and 154, 154' are disposed on the main surfaces and edges, respectively. Likewise, half bar 150b has electrodes 156 and 156' on its main surfaces and electrodes 158 and 158' on its edges. Electrodes 152 and 152' are interconnected by a metallic coating 160. Electrodes 152' and 158 are interconnected by a metallic coating 162 and electrodes 158 and 158' are interconnected by a metallic coating 164 provided on the end of the upper main surface of half bar 150b. Electrodes 156 and 154 are interconnected by a metallic coating 166, electrodes 156 and 154' are interconnected by a metallic coating 168, and electrodes 154' and 156' are interconnected by a metallic coating 170.

With such an arrangement, half bar 150a is of the same construction as tine 8' of tuning fork 3 of FIGS. 7 and 7a and half bar 150b is of the same construction as tine 10' thereof. The supply of electricity to and the support of bar 150 are obtained by four conductor wires disposed in nodal plane N'. More specifically, wires 172 and 172' are connected to electrodes 156 and 154', respectively, and are connected to a negative potential, while wires 174 and 174' are connected to electrodes 158 and 152', respectively, and are connected to a positive potential.

With this disposition of electrodes, the cut angle $\theta$ should have other values in order to obtain a utilizable piezo-electric coupling. In this case, the angle $\theta$ is within the range between $-50°$ and $-30°$ or within the range between $+30°$ and $+50°$. It is clear that these limits are not absolute, but correspond to constructions that are of practical interest. For the same type of electrodes, the ratio $e'/w'$ may be between 0.1 and 0.8. As in the case of the embodiments of FIGS. 1 and 1a, the parameters $\theta$ and $e'/w'$ may be selected either so as to cause $\beta$ to be zero while $\alpha$ has an acceptable value or so as to make the ratio of $\alpha$ to $\beta$ very high, $\beta$ having a small but none zero value.

By way of example, the following quartz tuning fork which has the electrode system shown in FIGS. 7 and 7a may be considered:

$\theta = -40°$
$e/w = 0.3$
$\alpha = 50 \times 10^{-6°}$ C.$^{-1}$
$\beta = 0$

Figures 9, 10:
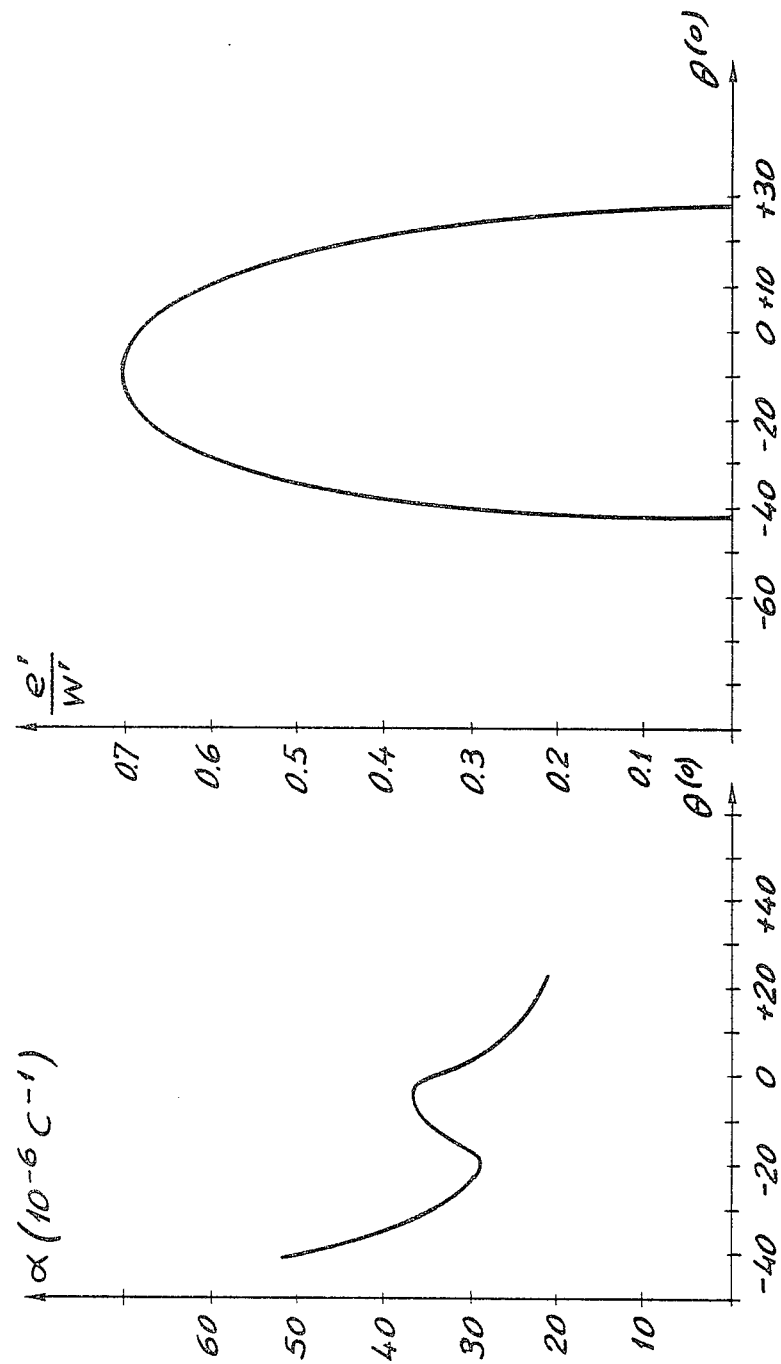
FIG. 9 is a graph representing the ratio e/w as a function of cut angle where $\beta = 0$.
FIG. 10 is a graph showing the values of $\alpha$ as a function of the angle $\theta$, where $\beta = 0$.

The curves shown in FIGS. 9 and 10 correspond to the case where it is specified that $\beta$ is to be zero, i.e. where it is specified that the relationship between temperature and frequency is to be strictly linear. The curve shown in FIG. 9 shows that it is possible to obtain a zero value of $\beta$ for the values of $\theta$ between $-42°$ and $+28°$ and of $e'/w'$ between 0 and 0.7. The curve of FIG. 10 shows that for this range of the cut angle $\theta$, $\alpha$ varies from $20 \times 10^{-6°}$ C.$^{-1}$ to $40 \times 10^{-6°}$ C.$^{-1}$.

Figure 4:
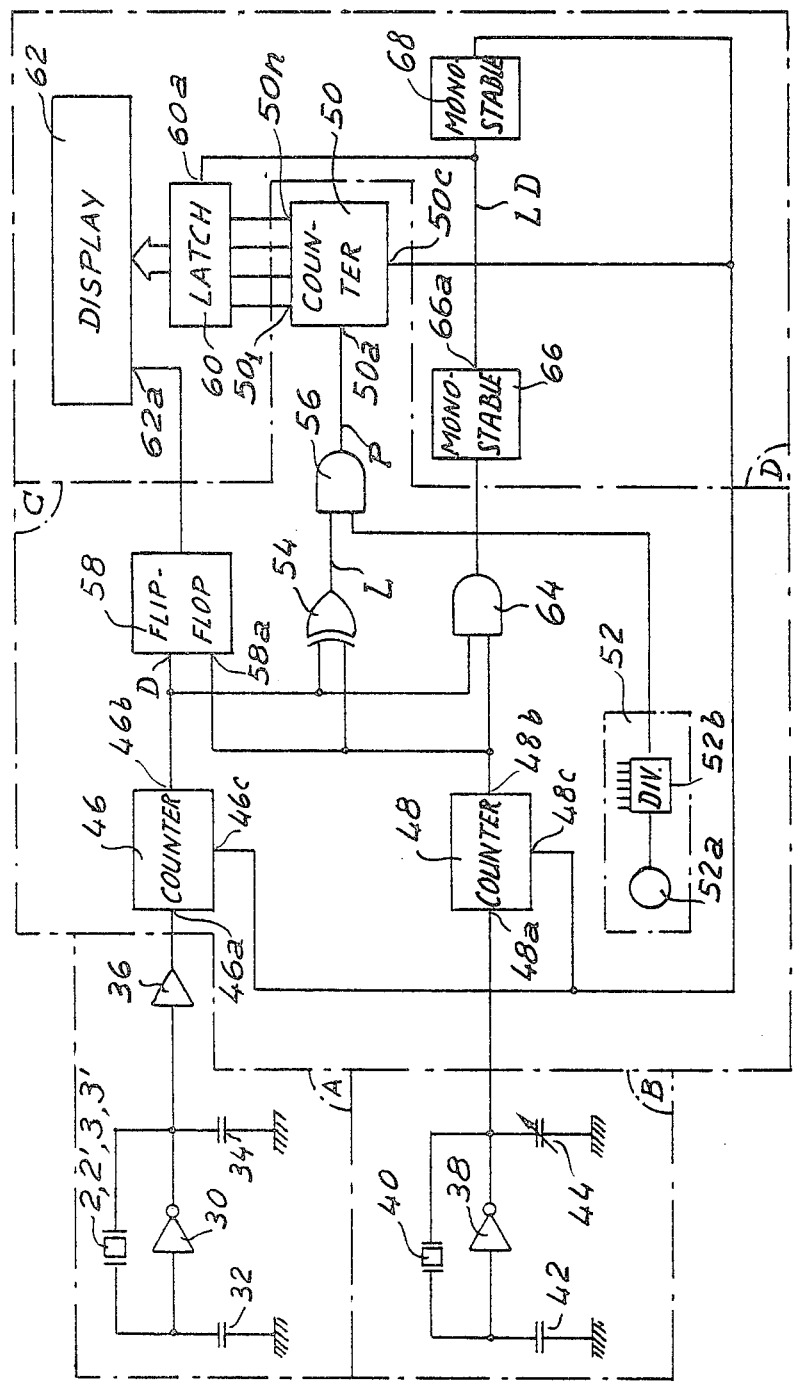
FIG. 4 is a block diagram of an electrical circuit for processing signals delivered by resonators according to the present invention.

Referring now to FIG. 4, there is shown a form of an electronic processing circuit which, together with the resonators previously described, constitutes a quartz thermometer. In a general way, the thermometer comprises an oscillatory measuring circuit A including the temperature pick-up constituted by the resonator; an oscillatory reference circuit B; a comparator circuit C; and a display and reset-to-zero circuit D.

Oscillatory measuring circuit A comprises the vibrating measuring element 2, 2', 3, or 3' previously referred to and an energizing circuit of known type. This circuit comprises an amplifier 30 with the vibrating element 2, 2', 3 or 3' arranged in its feedback path. Capacitors 32 and 34 are positioned between the input and output, respectively, of amplifier 30 and ground. The circuit is completed by a buffer amplifier 36 connected to the output of amplifier 30.

Oscillatory reference circuit B is arranged in substantially the same manner and comprises an amplifier 38 with an oscillatory reference element 40 in its feedback path. This circuit also includes capacitors 42 and 44 connected between the input and output, respectively, of amplifier 38 and ground. It should be noted that capacitor 44 is variable in order to be able to adjust the reference frequency, as will be explained more fully hereinafter.

Comparator C consists essentially of two counters capable of counting up to M (where M is a whole number) indicated by reference numerals 46 and 48, respectively, a third counter 50, and an electrical pulse generator 52, the frequency of which is adjustable. In particular, clock inputs 46a and 48a of counters 46 and 48, respectively, receive pulses emitted by oscillatory circuits A and B, respectively. The outputs 46b and 48b of counters 46 and 48, respectively, are connected to the two inputs of an exclusive OR gate 54. Variable frequency source 52 is preferably constituted by a generator 52a which delivers a pulse signal of a fixed high frequency to a programmable divider 52b. At the output of divider 52b, the signal then has the frequency $f_C$ regulated by the rate of division of divider 52b. Obviously, generator 52 could instead be constituted by an adjustable frequency generator.

The output of generator 52 and the output of gate 54 are connected to two inputs of an AND gate 56. The clock-input 50a of counter 50 receives the output of AND gate 56. The outputs of counters 46 and 48 are connected to the input D and the clock input 58a, respectively, of a D-type flip-flop 58, the function of which is to give the sign of the temperature measured by the oscillatory element, that is to say the order in which the wave fronts of the signals emitted by counters 46 and 48 appear.

Display and reset-to-zero circuit D comprises a latch 60, the inputs of which are connected to the binary outputs $50_1$ through $50_n$ of counter 50. Latch 60 is itself connected to a decoding and display assembly 62. Display assembly 62 has a special input 62a which is connected to the output of flip-flop 58 in order to display the sign of the temperature with respect to 0° C.

The outputs 46b and 48b of counters 46 and 48, respectively, are likewise connected to the two inputs of an AND gate 64. The output of gate 64 is connected to the input of a monostable multivibrator 66 which is of the "non re-excitable" type. The output 66a of multivibrator 66 delivers a control signal LD which is applied to the input of a second monostable multi-vibrator 68 and to the control input 60a of latch 60. Multi-vibrator 68 delivers a reset-to-zero pulse which is applied to the reset-to-zero inputs 46c, 48c and 50c of counters 46, 48 and 50, respectively.

Figure 5A:
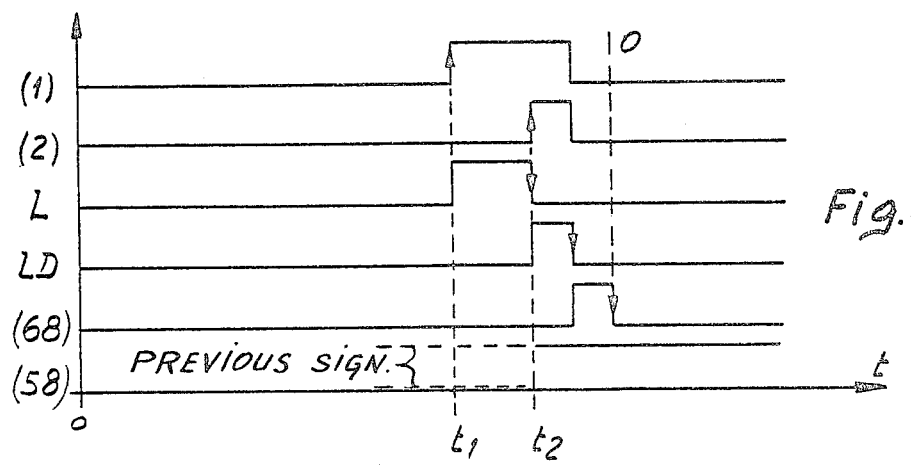
FIGS. 5a and 5b are time diagrams useful in explaining the operation of the circuit of FIG. 4.

In operation, counter 46 counts the pulses delivered by measuring oscillator A. When counter 46 has counted M pulses, its output passes to the logical state 1 as shown by the diagram (1) in FIGS. 5a and 5b. Simultaneously, counter 48 counts pulses delivered by reference oscillator B. When this counter has counted M pulses, its output passes to the logical state 1 as shown by the diagram (2) in FIGS. 5a and 5b. Let $T_t$ represent the time taken by counter 46 to count M pulses and $T_n$ represent the time taken by counter 48 to count M pulses. The signal L which appears at the output of gate 54 is in the logical state 1 between the times $t_1$ and $t_2$ when the outputs of counters 46 and 48 pass to the logical state 1. The signal L then remains in the logical state 1 during a period $T_t-T_n$. In the case of FIG. 5a, the time $T_t$ is shorter than the time $T_n$, the temperature to be measured being higher than the reference temperature.

Figure 5B:
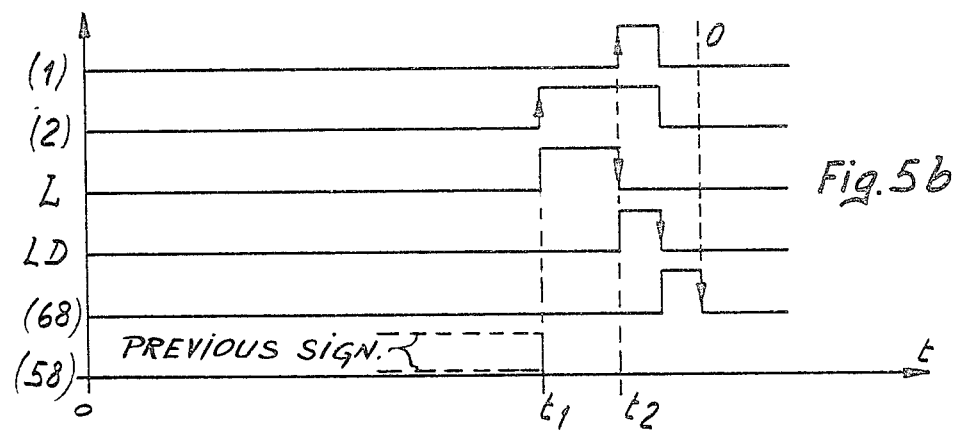

On the contrary, in the case of FIG. 5b, the time $T_t$ is longer than the time $T_n$, the temperature to be measured being lower than the reference temperature.

Counter 50 receives at its input pulses P emitted by AND gate 56. It accordingly receives the pulses emitted by generator 52 between the instants $t_1$ and $t_2$. Consequently, after the instant $t_2$ (see FIG. 5a), the contents in counter 50 is equal to the number of pulses N emitted by generator 52 during the time period $T_t-T_n$. This number N is representative of the temperature T to be measured, as will be explained more fully hereinafter.

At the instant $t_2$ (FIG. 5a), the output of AND gate 64 changes over to the logical state 1 which triggers monostable multi-vibrator 66 which changes state for a period of time $\tau_1$ fixed by its time constant, thereby producing the signal LD. The signal LD delivered by multi-vibrator 66 controls the release of latch 60 and the number N of pulses is applied to decoding and display system 62. The trailing edge of the signal LD brings about the change of state of the output of monostable multi-vibrator 68 which assumes the logical state 1 during a time period $\tau_2$. This pulse resets counters 46, 48 and 50 to zero. Accordingly, when the trailing edge of this pulse appears, the circuit is ready for a new temperature measurement.

Summarizing, counter 50 counts pulses of the signal delivered by pulse generator 52 within the time period limited by the instants $t_1$ and $t_2$. The number N of pulses represents the temperature T to be measured, the relationship between N and T being substantially linear because of the choise of the resonator.

Adjustment of the thermometer is achieved by adjusting the frequency $f_C$ of the signal emitted by generator 52 and the value of capacitor 44 of reference oscillator B.

Figure 6:
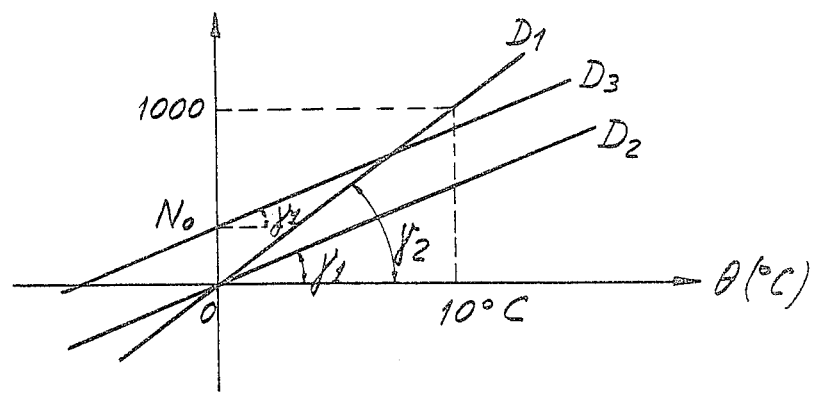
FIG. 6 is a graph illustrating different adjustments of the quartz thermometer.

FIG. 6 shows several graphs for different adjustments $D_1$, $D_2$ and $D_3$ which indicate the substantially straight line relationship between temperature T and the number N of pulses counted by counter 50. Modification of the frequency $f_C$ enables the ratio of proportionality between temperature T and the number of pulses N counted to be varied. It accordingly influences the angle $\gamma$. By contrast, adjustment of capacitor 44 alters the reference value, that is to say the number $N_o$ of pulses corresponding to 0° C. In FIG. 6, line $D_1$ corresponds to an optimum adjustment since $N_o=0$ for T=0° C. and the angle $\gamma=\gamma_2$ corresponds to a good sensitivity of the thermometer.

In order to adjust capacitor 44, oscillatory measuring circuit A is placed in an environment at 0° C. The time $T_t$ then corresponds to the reference temperature. Capacitor 44 is adjusted until counter 50 counts no pulse from generator 52. In this situation $T_n=T_t$ and oscillatory reference circuit b delivers a signal having a reference frequency corresponding to T=0° C. This adjustment procedure is of course independent of the adjustment of the frequency $f_C$. The value of the angle $\gamma$ is adjusted by varying the frequency $f_C$ without adjusting capacitor 44.

If the resonator has a coefficient of the first degree of $30\times10^{-6}$ °C.$^{-1}$ and if M has a value of $2.10^5$, an increase of 1° C. in the temperature causes a reduction in the counting time of 10 $\mu$s. If then the frequency $f_C$ is chosen so as to equal 10 MHz (the period of $T_C=0.1$ $\mu$s), N will be 100. Consequently, if the frequency of the resonator at T=0° C. is equal to 300 kHz, such a thermometer could measure temperature differences of 0.01° C.

In the example considered, two successive measurements will be separated by a time interval which is less than or equal to 400 ms if the time constants $\tau_1$ and $\tau_2$ of multi-vibrators 66 and 68 are suitably chosen.

The circuit which has been described is only one example of a circuit which is well adapted for dealing with the problem to be solved. It is clear, however, that other circuits could be used instead. It is sufficient that these circuits should include a device which enables the frequency difference between the signal emitted by the measuring oscillator and the signal emitted by the reference oscillator to be measured and a device for indicating this measurement preferably in numerical form.

It follows from the preceding description that due to the choice of the resonator and its method of excitation, the thermometer according to the present invention may be of simple and inexpensive construction. It appears equally clear that the production of the resonator is simplified if a tuning fork or bar is selected in which the cut plane is relatively close to a similar plane containing the Z axis (as in the embodiments according to FIGS. 1, 1a and 3). The processing circuit is very simple and permits easy adjustment of the thermometer. In addition, due to the fact that the resonator operates a frequency of the order of 300 kHz, the consumption of electricity is low.

In addition, in spite of these numerous simplifications, the thermometer enables a temperature measurement to be obtained with a good resolution and a periodicity of measurement which is sufficiently low for monitoring rapid variations of temperature.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

We claim:

1. A quartz thermometer comprising:
   a resonator including at least one elongate element made from a quartz crystal, the length of said element being substantially parallel to the X axis of said quartz crystal, said element having two main surfaces which are substantially parallel to each other and to said length and delimited by edges, said main surfaces being perpendicular to an axis Z' which is inclined at an angle of between $+30°$ and $-30°$ with respect to the optical axis Z of said quartz crystal;
   at least one first group of four electrodes disposed on said element, parallel to said length, said electrodes being disposed on said two main surfaces of said element, adjacent the edges thereof;
   means for applying two different voltages to two of said electrodes that are disposed on the same main surface and to two of said electrodes that are located opposite each other on different main surfaces so as to cause said element to vibrate torsionally and to emit a signal, the frequency variations of which are a substantially linear function of temperature;
   means for supporting said element for said torsional vibration; and
   an electronic circuit for processing said signal emitted by said resonator, said circuit comprising:
   a reference frequency oscillator; and
   means for comparing the frequency of the signal emitted by said resonator and the signal emitted by said reference frequency oscillator and for producing an indication of the temperature to which said resonator is subjected from the difference between the frequencies of these signals.

2. A thermometer according to claim 1, wherein said resonator comprises:
   a single element in the form of a parallelepipedal quartz of substantially rectangular cross-section, said cross section having a long side forming the main surfaces of said element and a short side perpendicular to said main surfaces, said element being divided into two half bars by a plane which is perpendicular to said length of said element and in which said supporting means are located;
   wherein said first group of electrodes is disposed on one of said half bars; and
   wherein a second group of four electrodes is disposed in the same manner as the first group on the other of said half bars;
   said different voltages being applied to the electrodes which are symmetrical with respect to said plane.

3. A thermometer according to claim 1, wherein said resonator comprises:
   two elements, each element consisting of one tine of a tuning fork, each tine having the form of a parallelepiped of rectangular cross section, said cross section having a long side forming said main surfaces of said element and a short side perpendicular to said main surfaces, said tines being disposed symmetrical with respect to a plane and connected together by a base to which said supporting means are fixed;
   wherein said first group of electrodes is disposed on one of said tines; and
   wherein a second group of four electrodes is disposed in the same manner as the first group on the other of said tines;
   said different voltages being applied to the electrodes which are symmetrical with respect to said plane.

4. A quartz thermometer according to claim 1, wherein said resonator has a fundamental frequency which is less than 1 MHz.

5. A thermometer according to claim 2 or 3, wherein the ratio of the lengths of said short and long sides of said cross section is between 0.4 and 0.8.

6. A thermometer according to claim 5, wherein said angle $\theta$ is between $+10°$ and $-10°$.

7. A thermometer according to claim 2 or 3, wherein the angle $\theta$ is substantially equal to $+2°$ and the ratio of the lengths of the short and long sides is substantially equal to 0.68.

8. A quartz thermometer comprising:
   a resonator including at least one elongate element made from a quartz crystal, the length of said element being substantially parallel to the X axis of said quartz crystal, said element having two main surfaces which are substantially parallel to each other and to said length and delimited by edges, said main surfaces being perpendicular to an axis Z' which is inclined with respect to the optical axis Z of said quartz crystal at an angle of between $+30°$ and $+50°$ or between $-30°$ and $-50°$, said element having two edges substantially parallel to said X axis;

at least one first group of four electrodes disposed on said element, parallel to said length, each of said two edges and each main surface being provided with one electrode;

means for applying a first voltage to the electrodes on the main surface and a second voltage to the electrodes on the edges so as to cause said element to vibrate torsionally and to emit a signal, the frequency variations of which are a substantially linear function of temperature;

means for supporting said element for said torsional vibration; and an electronic circuit for processing said signal emitted by said resonator, said circuit comprising:

a reference frequency oscillator; and means for comparing the frequency of the signal emitted by said resonator and the signal emitter by said reference frequency oscillator and for producing an indication of the temperature to which said resonator is subjected from the difference between the frequencies of these signals.

9. A thermometer according to claim 8, wherein said resonator comprises:

a single element in the form of a parallelepipedal quartz bar at substantially rectangular cross section, said cross section having a long side forming said main surfaces of said element and a short side perpendicular to said main surfaces, said element being divided into two half bars by a plane which is perpendicular to said length of said element and in which said supporting means are located;

wherein said first group of electrodes is disposed on one of said half bars; and wherein a second group of four electrodes is disposed in the same manner as the first group on the other of said half bars, the electrodes of the second group which are disposed on said main surfaces of said element having applied thereto said second voltage and the electrodes of said second group which are disposed on said two edges having applied thereto said first voltage.

10. A thermometer according to claim 9, wherein the ratio of the lengths of the short and long sides is between 0 and 1.

11. A thermometer according to claim 8, wherein said resonator comprises:

two elements, each element consisting of one tine of a tuning fork, each tine having the form of a parallelepiped of rectangular cross section, said cross section having a long side forming said main surfaces and a short side perpendicular to said main surfaces, said tines being connected by a base to which said supporting means are fixed;

wherein said first group of electrodes is disposed on one of said tines; and wherein a second group of four electrodes is disposed in the same manner as the first group on the other of said tines, the electrodes which are disposed on said main surfaces and on said edges of said other of said tines having applied thereto said second and first voltages, respectively.

12. A quartz thermometer according to claim 8, wherein said resonator has a fundamental frequency which is less than 1 MHz.

13. A thermometer according to claim 1 or 8, wherein said reference frequency is adjustable.

14. A thermometer according to claim 1 or 8, wherein said electronic circuit further comprises:

means for displaying the indication of temperature produced by said comparing means.

15. A thermometer according to claim 1 or 3, wherein said comparing means comprises:

means for counting M pulses emitted by said resonator and for delivering a first signal when M pulses are counted, wherein M is a whole number;

means for simultaneously counting M pulses emitted by said reference frequency oscillator and for delivering a second signal when M pulses are counted;

means for delivering a measurement signal of adjustable frequency; and means for counting the pulses of said measurement signal between said first and second signals.

* * * * *